United States Patent
Thimm et al.

(10) Patent No.: US 10,165,681 B2
(45) Date of Patent: Dec. 25, 2018

(54) METHOD FOR METALIZING VIAS

(71) Applicant: CeramTec GmbH, Plochingen (DE)

(72) Inventors: Alfred Thimm, Wunsiedel (DE); Klaus Herrmann, Thiersheim (DE)

(73) Assignee: CeramTec GmbH, Plochingen (DE)

(*) Notice: Subject to any disclaimer, the term of this patent is extended or adjusted under 35 U.S.C. 154(b) by 0 days.

(21) Appl. No.: 14/416,916

(22) PCT Filed: Jul. 26, 2013

(86) PCT No.: PCT/EP2013/065815
§ 371 (c)(1),
(2) Date: Jan. 23, 2015

(87) PCT Pub. No.: WO2014/019956
PCT Pub. Date: Feb. 6, 2014

(65) Prior Publication Data
US 2015/0282318 A1 Oct. 1, 2015

(30) Foreign Application Priority Data

Jul. 30, 2012 (DE) .................. 10 2012 213 346

(51) Int. Cl.
B05D 5/12 (2006.01)
H05K 1/11 (2006.01)
H01B 1/16 (2006.01)
H05K 3/00 (2006.01)
C04B 41/88 (2006.01)
C04B 41/00 (2006.01)
C04B 41/51 (2006.01)
C04B 111/00 (2006.01)

(52) U.S. Cl.
CPC ............ *H05K 1/115* (2013.01); *C04B 41/009* (2013.01); *C04B 41/5127* (2013.01); *C04B 41/88* (2013.01); *H01B 1/16* (2013.01); *H05K 3/0094* (2013.01); *C04B 2111/00844* (2013.01)

(58) Field of Classification Search
CPC combination set(s) only.
See application file for complete search history.

(56) References Cited

U.S. PATENT DOCUMENTS

| 3,830,651 A * | 8/1974 | Minneman ............ H05K 1/092 106/1.13 |
| 4,020,206 A | 4/1977 | Beil |
| 5,192,016 A * | 3/1993 | Araki ................... B23K 35/406 219/61 |
| 6,826,031 B2 | 11/2004 | Nagai et al. |
| 2004/0070915 A1* | 4/2004 | Nagai ............... C04B 35/62823 361/234 |
| 2004/0251449 A1* | 12/2004 | Yonezawa ................ C08K 3/08 252/500 |
| 2012/0037223 A1* | 2/2012 | Yamanaka ............... H01B 1/22 136/256 |
| 2012/0064291 A1* | 3/2012 | Lai ...................... H01L 23/5328 428/141 |
| 2012/0228560 A1* | 9/2012 | Jang ........................ C09J 11/04 252/514 |
| 2013/0251966 A1* | 9/2013 | Yu ......................... B82Y 30/00 428/208 |

FOREIGN PATENT DOCUMENTS

| JP | H09-46013 | 2/1997 |
| JP | H10-12045 | 1/1998 |
| JP | 2002-043740 | 2/2002 |
| JP | 2009-289587 | 12/2009 |
| JP | 2012-129238 | 7/2012 |
| WO | WO 2010/100893 | * 9/2010 |
| WO | WO 2011-055887 | * 5/2011 |
| WO | WO 2012/074200 | * 6/2012 |

OTHER PUBLICATIONS

Office Action issued in Japanese Patent Application No. 2015-524741, dated Mar. 26, 2018.

* cited by examiner

*Primary Examiner* — Austin Murata
(74) *Attorney, Agent, or Firm* — Norton Rose Fulbright US LLP

(57) ABSTRACT

A method for producing plated-through holes in printed circuit boards and to printed circuit boards produced in this manner.

19 Claims, No Drawings

METHOD FOR METALIZING VIAS

This application is a § 371 of International Application No. PCT/EP2013/065815 filed Jul. 26, 2013, and claims priority from German Patent Application No. 10 2012 213 346.1 filed Jul. 30, 2012.

FIELD OF THE INVENTION

The invention relates to a method for producing vias in circuit boards and to circuit boards produced in this way.

BACKGROUND OF THE INVENTION

Ceramic circuit boards often need to be electrically contactable from both sides and to allow for through-plating through the circuit board. In general, this is carried out by means of holes that are provided in the circuit board and are filled with an electrically conductive material. Such vias normally have diameters of approximately 100-300 µm.

What is nowadays usually used as an electrically conductive material are comparatively expensive silver or other precious metal pastes which are composed of one or more metal powder(s), optionally an adhesive glass proportion of 1-10% by weight, for example PbO, $B_2O_3$, $Bi_2O_3$ or $SiO_2$, and a high-boiling organic matter, comprising binders such as ethyl cellulose or polyvinyl butyral, and solvents such as Terpineol or Texanol. If the substrate material for the circuit boards consists of AlN, then ZnO, $SiO_2$, CaO, $TiO_2$ and $B_2O_3$ may be used as adhesive glasses.

Copper metallisations are also increasingly used as electrically conductive materials, wherein pastes filled with copper particles having diameters of approximately 1-10 µm and an adhesive glass proportion are often used for filling the vias. Subsequently, the material is burned in at 650-1200° C. in a nitrogen atmosphere having a low oxygen content (<1-100 ppm). If copper pastes are used, the problem arises that they greatly shrink, crack and/or fall back out of the vias during burning-in if they only consist of the usual substances mentioned above. In this case, large cavities and/or cracks may occur in the metallisation or in the binding region of the full-area metallisation. In the worst case, the vias may sinter together to form a pin and fall out of the hole. In cases in which cracks or cavities occur, the vias have an elevated electrical resistance and are not hermetically sealed either.

Tightness against the surrounding atmosphere is particularly important if oxygen-sensitive parts such as circuits (Si), LEDs or OLEDs are to be integrated. Towards the top, these components are usually protected by covers, lenses or the like, which are soldered or glued on. However, also the bottom has to be protected against the ingress of air or humidity, which is realised, inter alia, by means of hermetically sealed metallisations of the vias.

Attempts to counteract shrinking of the electrically conductive material during sintering are made by adding adhesive glass. Despite the adhesive glass contained in the paste, however, the negative effects of shrinking can often at least not sufficiently be avoided.

This phenomenon is a particular problem in the case of AlN ceramics because only few substances do not cause the decomposition of the AlN in heat. AlN is only metastable and decomposes forming the lowest energy aluminium compound $Al_2O_3$ under certain conditions. Some oxides, such as in particular the $Bi_2O_3$ that is often used, or the PbO that used to be applied, vehemently attack AlN, decomposing same to form aluminium oxide, lead and nitrogen according to the following reaction equation:

$$2AlN + 3PbO \rightarrow Al_2O_3 + 3Pb + N_2.$$

Other oxides such as ZnO decompose AlN only slowly, and therefore they are better suited as binders of the metallisation to ceramics. In addition, it is important in the case of AlN to achieve a low TCE (thermal coefficient of expansion) such that the compound does not crack.

Moreover, conventional additives such as lead oxide or bismuth oxide are to be avoided for ecological reasons, or they react too strongly with AlN. The nitrogen that is formed from the AlN as a result of the decomposition reaction, see above, makes the metallisation porous and causes it to swell.

OBJECTS OF THE INVENTION

The problem addressed by the invention is therefore that of providing a method by means of which vias that are held securely in the holes of the circuit boards and have good characteristics in relation to current conduction can be produced. The method provided should be based on conventional methods as far as possible in order to avoid cost-intensive retrofitting. Moreover, materials that allow the production of high-quality vias at low costs are to be provided.

SUMMARY OF THE INVENTION

The problem is solved by a method and a metallization according to the present invention as described herein.

DETAILED DESCRIPTION

Accordingly, a method for producing electrical vias, which avoids or in any case substantially reduces shrinking of the pastes during burning-in, comprises the following steps: mixing a paste, introducing the paste into holes of a circuit board and curing the paste under the effect of heat. Here, the paste comprises at least one electrically conductive material and fillers, wherein the fillers experience an increase in volume during curing, such that any volume shrinkage of the electrically conductive material is compensated by the curing under the effect of heat.

The invention is in principle suitable for circuit boards of any material, however, particularly preferred are circuit boards made of ceramics, in particular of a ceramics on the basis of AlN or $Al_2O_3$.

As an electrically conductive material, preferably copper particles, in particular having an average grain size d50 between 1 and 10 µm, may be used. Other conductive substances, in particular metals or metal alloys that are customary for these purposes, may also be used.

The fillers according to the invention may, for example, be nitride-forming substances that are added to the paste. Whilst being burnt-in under a nitrogen atmosphere, these substances or fillers nitrate and experience an increase in volume as a result of the nitration. This increase in volume compensates for reductions in volume of the conductive material, for example, by sintering the particles, at least to a large extent.

Such nitride-forming substances may in particular be aluminium, titanium, zirconium and/or mixtures of these substances. Preferably, these materials are added in amounts of 1-10% by weight, preferably 2-5% by weight, of the mixture for producing the pastes.

Further substances which experience an increase in volume during curing or conversion under the effect of heat may be swelling non-metals, in particular clays. According to a preferred embodiment of the invention, the swelling non-metals may constitute between 1 and 10% by weight, preferably between 2 and 5% by weight, of the mixture for producing the pastes.

Swelling clays comprise, for example, bentonite or montmorillonite which moreover advantageously have a high affinity to AlN or $Al_2O_3$ ceramics. A general affinity of the fillers to the ceramics used is generally desirable in order to ensure secure hold of the metallisation or of the electrically conductive material in the holes of the circuit board. With regard to the invention, affinity is understood as follows: the capacity of the electrically conductive material to form a solid bond with the material of the ceramics, which bond also does not immediately break under mechanical stress. The term "bond" is not only understood as a chemical compound, but generally as the durable joining of substances.

Each of the substances or fillers mentioned can, alone or in combination with others, compensate for the volume shrinkage of the electrically conductive material.

The mentioned metals that are added as fillers show, like the clay, an increase in volume during nitride formation, which compensates for the shrinkage of the electrically conductive material, in particular of the copper.

According to a preferred development of the invention, the adhesion between the metallisation and the circuit board substrate can be improved by means of oxides that react only slowly with the substrate material. If the substrate material consists, for example, of AlN, then ZnO, $SiO_2$, CaO, $TiO_2$ and $B_2O_3$ can be used as oxides that react only slowly with the substrate material. Moreover, also CuCl may be added as an adhesion-promoting substance that forms elemental copper under the effect of heat.

Moreover, adhesive glasses may additionally be added. In an $Al_2O_3$ ceramic substrate, adhesive glasses containing $Bi_2O_3$ are preferably used. These glasses have a thermal coefficient of expansion (TCE) that prevents the formation of cracks caused by stresses during the curing of the paste. Instead or in addition, adhesive glasses containing ZnO may also be added.

In the case of AlN ceramics as circuit board substrate, adhesive glasses containing ZnO are preferably added. However, adhesive glasses containing $Bi_2O_3$, as are preferably used in ceramic substrates containing $Al_2O_3$, are not particularly suitable for AlN ceramics because these glasses bond poorly with AlN, and their tensile stress may lead to cracks in the AlN ceramics.

A general formulation for a metallisation may be as follows:

- oil, thixotropic: 5-20% by weight, preferably 8-12% by weight;
- oil, screen printing medium: 5-20% by weight, preferably 8-12% by weight;
- electrically conductive material: 10-89% by weight, preferably 50-80% by weight;
- fillers, total: 2-25% by weight, preferably 4-15% by weight, of which
  - nitride-forming substances, in each case: 1-10% by weight, preferably 2-5% by weight;
  - swelling non-metals, in each case: 1-10% by weight, preferably 2-5% by weight;
  - adhesion-promoting substance, in each case: 0.1-5% by weight.

The invention will be explained in more detail below by way of examples. The examples are merely intended to explain the invention and are in no way to be regarded as limiting the invention.

A paste for metallising vias in an AlN or $Al_2O_3$ ceramic substrate is produced according to the following recipe:

| | |
|---|---|
| oil, THIXOTROPIC | 10% by weight |
| oil, screen printing medium | 10% by weight |
| copper powder, d50 = 10 μm | 1-90%, preferably 50% by weight |
| copper powder, d50 = 1 μm | 0-50%, preferably 12% by weight |
| aluminium powder, d50 = 8 μm | 0.1-10%, preferably 5% by weight |
| bentonite, d50 = 12 μm | 0.0-10%, preferably 5% by weight |
| zinc oxide, d50 = 5 μm | 0.1-5%, preferably 2% by weight |
| quartz flour, d50 = 6 μm | 0.1-5%, preferably 1.5% by weight |
| boron oxide, d50 = 10 μm | 0.1-5%, preferably 1.5% by weight |
| copper(I) chloride, d50 = 5 μm | 0.1-5%, preferably 3% by weight |

The solid weighed components of the paste are mixed in a tub using a spatula. Subsequently, the weighed oils are added. As thixotropic oil, HERAEUS 212/thix may preferably be selected, which is liquefied using HERAEUS 213 oil. The substances are coarsely mixed with a spatula and then slowly (approximately 1-2 kg/min) run through a three-roll mill (for example, EXAKT or the like) twice.

A ceramic substrate made of AlN and having a thickness of 0.5 mm is used; the vias to be filled have a diameter of 0.15 mm. The paste is filled into a screen having openings directly above the vias, i.e. the holes to be filled in the sintered ceramic substrate. The paste is then brushed into the vias using a plastic blade. The vias may have been punched in a raw state or laser-cut in a burnt state. Low sintering glass ceramic substrates (approximately 900-930° C.) may also be filled in a still vitric state and subsequently ceramicised with the paste filled in. The grain sizes of the components of the paste should preferably not exceed 20 μm, otherwise they could clog up the conventional screen fabrics and may have insufficient reactivity. This can lead to undesired cavity formation or to too few reactants in the vicinity.

In order to introduce the paste into the holes of the ceramic substrate, screen printing methods are preferred, since the circuit boards are frequently printed using screen printing methods, and therefore this type of application can be realised in an efficient and simple manner. In principle, however, also any other methods are possible by means of which the holes of the circuit board can be filled with the paste.

Burning-in is carried out at temperatures between 800 and 1000° C., preferably at 900° C., under a nitrogen atmosphere with a low oxygen partial pressure and was carried out in the example mentioned above at 900° C. for 10 min at maximum temperature; in the example mentioned above, the oxygen partial pressure was 10 ppm.

The result shows that the vias are well filled, are slightly porous and the copper adheres to the AlN ceramic. The metallisation closes a hole in the circuit board in a hermetically sealed manner. The helium leak test according to DIN EN 1779:1999 results in $10^{-8}$ mbar/l*sec.

By comparison, a paste without additives, just with copper, i.e. without aluminium and bentonite, was filled into the vias of an AlN substrate and burned-in.

The metallisation shows large cavities and does not adhere to the wall in some places. The electric resistance is, due to cracks, 30% higher than in the example above, the vias are not hermetically sealed (helium leak test $>10^{-6}$ mbar/l*sec).

It is claimed:

1. A method for producing an electric via in a circuit board, comprising the steps of:

mixing an oil, an electrically conductive material and a filler to form a paste, wherein the electrically conductive material comprises copper particles;

introducing the paste into a hole of a circuit board; and curing the paste under the effect of heat;

wherein while curing, the filler increases in volume such that a volume shrinkage of the electrically conductive material is compensated by the curing under the effect of heat;

wherein the filler comprises a swelling non-metal clay which swells under the effect of heat and thus increases in volume during the curing step and from 1 to 10 wt. % of an elemental form of at least one member selected from the group consisting of aluminum, titanium and zirconium;

an adhesive; and further comprising a step of nitrating the clay, wherein the nitrating is provided by burning-in at a temperature between 800 and 1000° C. under a nitrogen atmosphere, wherein the clay increases in volume during nitration.

2. A method according to claim 1, wherein the circuit board comprises a ceramic.

3. A method according to claim 1, wherein the filler constitutes 2-25% by weight, of the overall mass of the paste.

4. A method according to claim 1, wherein the filler comprises aluminum.

5. A method according to claim 1, wherein the filler comprises a swelling non-metal which swells as under the effect of heat and thus experience an increase in volume during curing.

6. A method according to claim 1, wherein the clay comprises bentonite.

7. A method according to claim 1, wherein the circuit board comprises a ceramic, and wherein the clay is selected in such a way that they have an affinity to the ceramic of the circuit board.

8. A method according to claim 1, wherein the clay comprises at least one member selected from the group consisting of bentonite and montmorillonite.

9. A method according to claim 1, wherein the paste further comprises an adhesion-promoting substance which enhance the affinity of the paste or the metallization to the substrate of the circuit board, wherein the adhesion promoting substance is selected from the group consisting of an oxide and CuCl.

10. A method according to claim 9, wherein the adhesion-promoting substance is an oxide selected from the group consisting of ZnO, $SiO_2$, CaO, $TiO_2$ and $B_2O_3$.

11. A method according to claim 9, wherein the adhesion promoting substance is CuCl.

12. A method according to claim 1, wherein the paste is introduced by means of a screen printing method.

13. A circuit board with the via prepared according to the process the method according to claim 1, comprising the electrically conductive material and the filler, wherein the metallization hermetically seals a hole in the circuit board.

14. A circuit board according to claim 13, wherein the helium leak test according to DIN EN 1779:1999 results in values of less than $10^{-7}$ mbar/l*sec for the via.

15. The method of claim 1, wherein the oil comprises a thixotropic oil and an oil for screen printing medium.

16. A method for producing electric vias in a circuit board, comprising the steps of:

mixing an oil, an electrically conductive material and a filler to form a paste, wherein the electrically conductive material comprises copper particles;

introducing the paste into a hole of a circuit board; and curing the paste with heat;

wherein while curing, the filler increases in volume such that a volume shrinkage of the electrically conductive material is compensated by the curing under the effect of heat;

wherein the filler comprises a swelling non-metal comprises a clay, wherein said clay which swells under the effect of heat and thus experiences an increase in volume during the curing step;

wherein the filler further comprises at least one metal selected from the group consisting of aluminum, titanium and zirconium; and wherein the metal is nitrated under a nitrogen atmosphere; and further comprising a step of nitrating the clay, wherein the nitrating is provided by burning-in at a temperature between 800 and 1000° C. under a nitrogen atmosphere, wherein the clay increases in volume during nitration.

17. The method of claim 16, wherein the oil comprises a thixotropic oil and an oil for screen printing medium.

18. A method for producing electric vias in a circuit board, comprising the steps of:

mixing of a paste;

introducing the paste into a hole of a circuit board; and curing the paste under the effect of heat;

wherein the paste consists of an oil, an electrically conductive material, an adhesion promoting substance, an adhesive glass and a filler, wherein the electrically conductive material comprises copper particles, wherein while curing, the filler increases in volume such that a volume shrinkage of the electrically conductive material is compensated by the curing under the effect of heat;

wherein the filler comprises a swelling non-metal comprises a clay, and an elemental metal;

wherein the adhesive promoting substance is an oxide wherein said clay which swells under the effect of heat and thus experiences an increase in volume during the curing step; and wherein the filler further comprises a nitrated elemental form of at least one member selected from the group consisting of aluminum, titanium and zirconium; and further comprising a step of nitrating the clay, wherein the nitrating is provided by burning-in at a temperature between 800 and 1000° C. under a nitrogen atmosphere, wherein the clay increases in volume during nitration.

19. The method of claim 18, wherein the oil comprises a thixotropic oil and an oil for screen printing medium.

* * * * *